(12) United States Patent
Thorslund et al.

(10) Patent No.: US 11,708,824 B2
(45) Date of Patent: Jul. 25, 2023

(54) ELECTROHYDRODYNAMIC CONTROL DEVICE

(71) Applicant: APR Technologies AB, Enköping (SE)

(72) Inventors: Robert Thorslund, Steningehöjden (SE); Peter Nilsson, Sundbyberg (SE)

(73) Assignee: APR Technologies AB

( * ) Notice: Subject to any disclaimer, the term of this patent is extended or adjusted under 35 U.S.C. 154(b) by 1277 days.

(21) Appl. No.: 16/071,476

(22) PCT Filed: Jan. 20, 2017

(86) PCT No.: PCT/SE2017/050059
§ 371 (c)(1),
(2) Date: Jul. 19, 2018

(87) PCT Pub. No.: WO2017/127017
PCT Pub. Date: Jul. 27, 2017

(65) Prior Publication Data
US 2021/0082786 A1 Mar. 18, 2021

(30) Foreign Application Priority Data
Jan. 20, 2016 (SE) .................................. 1650061-3

(51) Int. Cl.
*F04B 19/00* (2006.01)
*H01L 23/467* (2006.01)
(Continued)

(52) U.S. Cl.
CPC ............ *F04B 19/006* (2013.01); *F04B 19/00* (2013.01); *F04B 33/00* (2013.01); *F04B 37/10* (2013.01);
(Continued)

(58) Field of Classification Search
CPC ......... H01L 2924/0002; H01L 2924/00; H01L 23/467; F04B 19/006; F04B 19/00;
(Continued)

(56) References Cited

U.S. PATENT DOCUMENTS 3,400,882 A * 9/1968 McManus ............... H01J 41/20
417/48
5,180,288 A * 1/1993 Richter .................... F04D 33/00
417/48

(Continued)

FOREIGN PATENT DOCUMENTS

DE   202014000176 U1   2/2014
EP       1901352 A1   3/2008
(Continued)

*Primary Examiner* — Peter J Bertheaud
(74) *Attorney, Agent, or Firm* — Condo Roccia Koptiw LLP

(57) ABSTRACT

A fluidic device is disclosed, comprising an enclosed passage that is adapted to convey a circulating fluid. The enclosed passage comprises a flow unit having a first electrode and a second electrode offset from the first electrode in a downstream direction of a flow of the circulating fluid. The first electrode is formed as a grid structure and arranged to allow the circulating fluid to flow through the first electrode. The fluidic device may be used for controlling or regulating the flow of the fluid circulating in the enclosed passage, and thereby act as a valve opening, reducing or even closing the passage.

20 Claims, 6 Drawing Sheets

(51) Int. Cl.

| | | |
|---|---|---|
| *F04B 53/00* | (2006.01) | |
| *F28F 13/16* | (2006.01) | |
| *F04B 43/04* | (2006.01) | |
| *F04B 37/10* | (2006.01) | |
| *F04B 33/00* | (2006.01) | |
| *F04B 39/06* | (2006.01) | |
| *H01J 41/18* | (2006.01) | |
| *F04B 17/03* | (2006.01) | |
| *F04B 49/06* | (2006.01) | |
| *H02K 44/00* | (2006.01) | |
| *H02K 44/02* | (2006.01) | |

(52) U.S. Cl.
CPC ............ *F04B 39/06* (2013.01); *F04B 43/043* (2013.01); *F04B 53/00* (2013.01); *F28F 13/16* (2013.01); *H01J 41/18* (2013.01); *H01L 23/467* (2013.01); *F04B 17/03* (2013.01); *F04B 49/06* (2013.01); *H01L 2924/00* (2013.01); *H01L 2924/0002* (2013.01); *H02K 44/00* (2013.01); *H02K 44/02* (2013.01)

(58) Field of Classification Search
CPC ........ F04B 37/10; F04B 39/06; F04B 43/043; F04B 33/00; F04B 53/00; F04B 17/03; F04B 49/06; F04D 33/00; F28F 13/16; H01J 41/18; H02K 44/00; H02K 44/02
See application file for complete search history.

(56) References Cited

U.S. PATENT DOCUMENTS

| | | | |
|---|---|---|---|
| 7,494,326 B2 * | 2/2009 | Bonne | ................... B82Y 10/00 |
| | | | 417/48 |
| 2004/0234378 A1 * | 11/2004 | Lovette | ............... F28D 15/0266 |
| | | | 257/E23.098 |
| 2009/0321056 A1 | 12/2009 | Ran et al. | |
| 2010/0177519 A1 | 7/2010 | Deschenaux et al. | |
| 2010/0177549 A1 | 7/2010 | Schlitz | |
| 2011/0097215 A1 * | 4/2011 | O'Shaughnessy | ... B01D 61/427 |
| | | | 417/572 |
| 2011/0116206 A1 * | 5/2011 | Kim | ..................... H01L 23/467 |
| | | | 361/231 |
| 2011/0139408 A1 | 6/2011 | Jewell-Larsen et al. | |
| 2011/0157813 A1 | 6/2011 | MacDonald et al. | |
| 2012/0002342 A1 | 1/2012 | Lee et al. | |
| 2015/0114608 A1 | 4/2015 | He et al. | |

FOREIGN PATENT DOCUMENTS

| | | | | |
|---|---|---|---|---|
| JP | 2010-063342 A | | 3/2010 | |
| JP | 2011-135074 A | | 7/2011 | |
| JP | 2014-212625 A | | 11/2014 | |
| SE | 1550716 A1 | | 12/2016 | |
| WO | WO 2009-094441 A2 | | 7/2009 | |
| WO | WO 2011/058411 A2 | | 5/2011 | |
| WO | WO2015/084238 | * | 6/2015 | .............. F04B 19/00 |
| WO | WO 2015-084238 A1 | | 6/2015 | |
| WO | WO 2016/195570 A1 | | 12/2016 | |

* cited by examiner

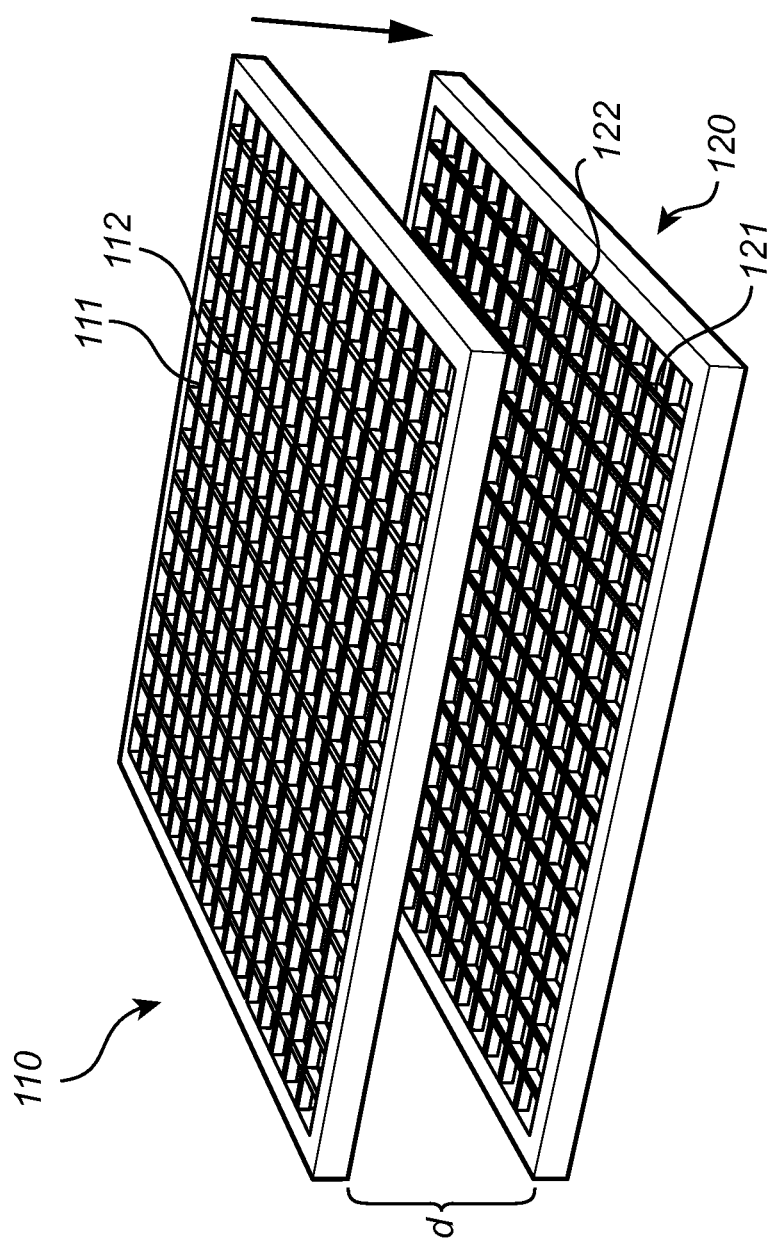

ELECTROHYDRODYNAMIC CONTROL DEVICE

CROSS REFERENCE TO RELATED APPLICATIONS

This application is the National Stage Entry under 35 U.S.C. § 371 of Patent Cooperation Treaty Application No. PCT/SE2017/050059, filed 20 Jan. 2017, which claims priority from Sweden Application No. 1650061-3, filed 20 Jan. 2016, the contents of which are hereby incorporated by reference herein.

FIELD OF THE INVENTION

The invention disclosed herein relates to devices for circulating fluids. More precisely, it relates to a closed loop system wherein the flow of a circulating fluid, such as e.g. a thermal management liquid, may be regulated by means of a flow unit.

BACKGROUND OF THE INVENTION

The performance of electronic systems is to a large extent limited by the available thermal management techniques for keeping the electronics within an appropriate temperature range. Smaller electronic devices having improved performance are associated with increased heat dissipation over a relatively small area. In other words, there is a growing need for space and energy efficient thermal management of electronic devices.

As an example, satellites, such as telecommunication satellites, are approaching the technology limits of existing on-board thermal management systems. The power dissipation of these satellites increases to meet the growing requirements for broadcasting, broadband multimedia and mobile communications services. Micro, nano, or 'cube' satellites, which require low-mass heat removal from electronic components (satellite on-chip) are likely to need more compact thermal management systems for maintaining a high performance.

These issues have been addressed using active cooling systems using forced flows of fluids so as to improve the cooling efficiency. One example of such active cooling systems includes electrohydrodynamical (EHD) pumps wherein ionized particles or molecules interact with an electric field and entrain a flow of a thermal management medium.

Even though such EHD pumps may be employed in various thermal management applications, there is still a need for an improved device and method for controlling the flow of a fluid and for providing improved thermal management.

SUMMARY

It is an object of at least some of the embodiments of the present invention to provide a device allowing for an improved control the flow of a thermal management fluid. It is a particular object to improve the control of a circulating fluid in a fluidic device.

Accordingly, the present invention provides a device and a method in such a device with the features of the independent claims. The dependent claims defined advantageous embodiments.

In a first aspect, a fluidic device is provided. The fluidic device comprises an enclosed passage that is adapted to convey a circulating fluid. The enclosed passage may e.g. define a closed loop in which the fluid may circulate. Further, a flow unit is arranged in the enclosed passage. The flow unit comprises a first electrode and a second electrode, wherein the second electrode is offset from the first electrode in a downstream direction of a flow of the circulating fluid. The first electrode and the second electrode are connectable to a voltage source. According to the present aspect, the first electrode is formed as a grid structure allowing the circulating fluid to flow through the first electrode.

In a second aspect, a method in a fluidic device according to the first aspect is provided. The method comprises the steps of activating the flow unit so as to induce a flow of the fluid in the fluidic device, and deactivating the fluidic device so as to impede a flow of the fluid in the fluidic device.

The present invention is advantageous in that the fluidic device may be used for controlling or regulating the flow of the fluid circulating in the enclosed passage. In other words, the flow unit may act or operate as a valve opening, reducing or even closing the passage.

By activating the flow unit, i.e., applying a voltage difference between the electrodes of the flow unit, the fluid may be brought to flow or circulate in the enclosed passage to provide a path having a relatively high heat flow (or low thermal resistance) between two points or portions of the fluidic device, and in particular the enclosed passage. The circulating fluid may be utilized for heat transport for heating or cooling purposes. The heat may e.g. be transported away from a heat generating application such as e.g. an electronic circuit or device, and dissipated to the surroundings or transferred to a heat sink in thermal contact with the enclosed passage. In e.g. a satellite, examples of heat sinks may include a radiator, a heat pipe or any type of mechanical structure.

By deactivating, or turning off the flow unit, the fluidic device may be put in an operational mode wherein the flow through the flow unit may be reduced or eliminated. This may e.g. be achieved by reducing or removing the voltage difference between the electrodes, or applying a voltage difference counteracting a flow through the flow unit. By reducing or eliminating the flow through the flow unit, the circulation of the fluid in the enclosed passage or loop may be reduced or even stopped. This may provide a path having a relatively low heat flow (or high thermal resistance) between two points of the fluidic device, and in particular the enclosed passage. This is of particular interest in e.g. space applications wherein the cooling system can be 'turned off' when parts of the system, such as the heat dissipating parts or heat sink, face e.g. the sun or the cold space. By reducing or stopping the circulation of the fluid, the heat entering the system from the surroundings may be prevented from reaching the parts of the system that need to be thermally managed or protected from overheating or from getting to cool.

Thus, the present invention provides a closed system that can be utilised in e.g. thermal management applications requiring improved thermal management. The fluidic device may be of particular interest in e.g. space applications, wherein harsh environmental conditions and limited or non-existent possibilities for service and maintenance requires efficient and reliable solutions as well as solutions that can regulate the heat transporting capabilities of the thermal management system.

By 'grid' it is understood any structure comprising bridges that are joined to each other so as to e.g. a grating, net, or honeycomb structure, etc. The bridges and the joints define open areas of the grid which admit a fluid flow.

By the term 'direction of flow' or 'flow direction' should be understood the main direction of the resulting net flow of gaseous fluid passing through the device during operation. The term may also be referred to as 'intended direction of flow'.

By 'passage' should be understood any duct, vessel, chamber or channel suitable for conveying a flow of a fluid. The fluid may e.g. circulate in a passage forming a closed loop, and/or in a chamber allowing the fluid to circulate within said chamber.

Examples of fluids, i.e. liquids and gases, that can be pumped by means of embodiments of the inventions includes e.g. dielectrics such as acetone, alcohols, helium, nitrogen, and fluorocarbon-based fluids such as e.g. Fluorinert™ or Novec™.

The first electrode may also be referred to an "emitter" or "emitter electrode", whereas the second electrode may be referred to as "collector" or "collector electrode". During use, the emitter may be adapted to emit electrons into the fluid and/or to negatively charge matter, such as particles or impurities of the fluid, in a close proximity of the emitter.

The first and/or second electrodes may advantageously comprise a material that has a relatively good ability of emitting electrons and is chemically stable, or inert, in relation to the pumped fluid. Further, the material may have a relatively high temperature resistance. Examples of such materials may include e.g. Pt, Au, and stainless steel.

According to an embodiment, the first electrode may comprise bridges and joints forming the grid structure. Further, at least a portion of at least one of the bridges may have a maximum height in a direction parallel to the direction of the flow and a maximum gauge in a direction orthogonal to the direction of the flow, wherein the maximum height may be larger than said maximum gauge.

By forming a grid of bridges that have a relatively large height in relation to their gauge, the grid may be relatively rigid in terms of its ability to carry loads in the height direction of the bridges, or the direction of the flow. Thereby, a relatively rigid electrode is provided, which is less prone to bend or deform, especially in the direction of the flow, and hence the risk for e.g. short-circuiting of the device may be reduced. Further, the relatively rigid and stable grid may still have a relatively large open area which may provide a relatively low flow resistance being met by the fluid passing through the grid. Further, the relatively high and narrow bridges may reduce the amount of material required for forming a relatively stable and rigid grid, which may reduce both weight and cost of the device. By using a relatively rigid grid, the need for additional support structures may be reduced and a relatively well defined and constant spacing between the first and second electrodes may be achieved. The spacing may e.g. be within the range of 10-2000 μm, and more preferably in the range of 50-1000 μm.

With their relatively large height, the bridges also provide a relatively large contact surface between the grid structure and the passing fluid, which may facilitate any interactions between the electrode and the fluid, such as e.g. diffusion of material and/or injection of ions or electrons.

The distance, or spacing, between the first and the second electrode may be varied so as to control the strength of the electric field being induced between the electrodes. Experiments have shown that a smaller gap, and thus a stronger induced electric field, may enable increased pump efficiency, or flow rate, as compared to devices having a larger gap and being supplied with the same electric power.

According to some embodiments, the flow unit may be arranged to cover at least part of a cross section of the enclosed passage. Preferably, the flow unit may be arranged to cover an entire cross section of the enclosed passage. A flow unit not covering the entire cross section of the passage may allow for a leak flow, i.e., a flow of fluid passing at the side of the flow unit rather than through it. Consequently, a flow unit covering the entire cross section of the passage may prevent any such leak flow. Further, a larger coverage of the flow unit may lead to a fluidic device having an increased pumping and/or blocking efficiency.

Alternatively, or additionally, the flow unit may be arranged in a (preferably single) chamber such that a circulating flow is achieved within the chamber. The flow unit may e.g. be arranged adjacent to a wall portion of the chamber and oriented such that the fluid passing through the flow unit may induce a circulation of the fluid in the chamber.

According to an embodiment, the fluidic device may comprise an array of flow units arranged to have a lateral extension in a common lateral plane, wherein a downstream side of a first one of the flow units may be in fluid communication with an upstream side of a second one of the flow units so as to allow the circulating fluid to pass through said first and second one of the flow units.

By arranging the flow units in an array extending in a lateral plane, a relatively flat and/or thin flow unit may be achieved that may be advantageous over flow units comprising several, stacked stages. Arranging a plurality of flow units abreast instead of above each other in a stack allows for the total height to be reduced, thereby allowing for a flow unit or array that can be used in applications wherein space is limited. Further, a thinner and/or flatter pump may have a larger surface-to-volume ratio, which may facilitate cooling or dissipation through an outer surface of the array.

Connecting a downstream side of a first flow unit with an upstream side of a second or neighbouring flow unit allows for the fluid to be pumped or accelerated in several steps, which may increase e.g. pumping efficiency, flow velocity, and volumetric flow rate of the array. This arrangement may be similar to an array of series connected or cascade connected flow units for enhancing, controlling or manipulating a flow of the fluid. Pressure, volumetric flow or velocity of the fluid flow may be increased at each, or at least some of, the flow units in the array.

The flow units of the array may be oriented in the same direction, i.e., such that the downstream side of each flow unit, respectively, faces in a same direction. In other words, the flow units may be arranged abreast such that the direction of fluid flow is parallel for each flow unit. Such orientation may facilitate manufacturing and assembling of the array. Arranging all flow units in a same orientation, e.g. with the upstream side facing a first direction and the downstream side facing a second, possibly opposing, direction may also facilitate electrical connection of the flow units. In one example, this allows for all first electrodes to be electrically connected on a first side of the array and/or the second electrodes to be electrically connected on a second side of the array.

Alternatively, the array may comprise at least one flow unit pointing, or being oriented, in an opposite direction as compared to the other flow units of the array. This may facilitate or simplify the fluid communication between two oppositely arranged flow units, since the fluid flow may exit the first one of the flow units and enter the second one of the flow units at the same side of the array. Shifting or alternating the orientation of one or several of the fluid units may further reduce the size of the array, thereby allowing for a smaller and yet relatively efficient array.

According to an embodiment, at least a portion of the enclosed passage may be adapted to be thermally connected to a heat transferring means so as to allow transfer of heat between the circulating fluid and a surrounding of the fluidic device.

According to some embodiments, the enclosed passage may be adapted to be thermally connected to, and/or in fluid connection with, a heat exchanger. The heat exchanger may e.g. be a heat sink or cold plate, or a heat source or hot plate.

According to an embodiment, the enclosed passage may be formed of a first chamber in fluid communication with a second chamber. Further, the flow unit may be arranged in one of the first chamber and the second chamber.

According to an embodiment, at least a portion of the enclosed passage may be formed as a tube.

According to an embodiment, the second electrode may be formed as a grid structure that allows the fluid to flow through the second electrode. At least one of the bridges may comprise a portion having a maximum height in a direction parallel to the direction of the flow and a maximum gauge in a direction orthogonal to the direction of the flow, wherein the maximum height may be larger than the maximum gauge, preferably at least twice the maximum gauge. The present embodiment is associated with similar advantages and effects as described with reference to the structure of the grid of the first electrode.

Alternatively, or additionally, the first and/or second electrode may be formed as, or comprise, a rod having a height or length corresponding to the maximum height and width, or thickness, corresponding to the maximum width. The rod may e.g. be formed as a cylinder, pillar or needle, and may be hollow, solid, or porous. In one example, the rod may be adapted to let a flow of gaseous fluid pass through its interior. Furthermore, the rod may have a tapered or pointed end portion, preferably in a direction of the fluid flow. In a further example, the first and/or second electrode may be formed of or comprise a plurality of rods, which e.g. may be arranged such to have a length extension essentially parallel to the fluid flow, and/or arranged in a two or three dimensional array. Using a plurality of rods, and hence a plurality of emitting points, is advantageous in that is may increase the redundancy of the emitter.

According to an embodiment, at least one of the first electrode and the second electrode may comprise a suspension structure. The suspension structure may, advantageously, be arranged to absorb thermally induced deformations in the first electrode or the second electrode, respectively. The suspension structure may thus be used to mitigate or compensate for thermally induced stresses, particularly in a plane orthogonal to the direction of the fluid flow and/or in a main length direction of at least a portion of the first or second electrodes. The deformation structure may e.g. be formed by a bridge being curved in the plane orthogonal to the direction of the flow. As the bridge is exposed to stresses or torsional torques in the plane orthogonal to its height (i.e. the flow direction), the bridge may due to its relatively large height and small gauge tend to deform in that plane rather than in the flow or height direction. Alternatively, the suspension structure may be adapted to apply a tensile stress to the electrode such that it may maintain its shape in a main length direction during thermal expansion. The deformation (or suspension) structure advantageously allows for a device being less sensitive to thermally induced stresses and thermal expansion. Thereby a device having relatively well defined dimensions and a relatively reliable shape may be achieved. Furthermore, the deformation structure may allow materials having different coefficients of thermal expansion (CTE) to be combined. As an example, the first and/or the second electrodes may be formed of a material having a first CTE whereas the support structure, to which the first and/or the second electrodes may be attached, may have another CTE. In such case, a deformation structure may be provided in the electrodes and/or the support structure so as to enable any internal thermal stresses that may be caused by the difference in CTE to be absorbed by the deformation structure being deformed in the plane orthogonal to the direction of the fluid flow. Thus, the deformation structure may enable a more reliable device having a prolonged life.

It will be appreciated that the first electrode and/or the second electrode and/or the support structure may be formed of a material that is selectively deposited so as to form the desired structure. The material may e.g. comprise a stacked structure of one or several metals. The depositing method may e.g. comprise molding, plating, screen printing, glazing, sputtering, evaporation or sintering. Alternatively, or additionally, the manufacturing may comprise removal of material, e.g. by selectively removing material from a substrate. Examples of suitable techniques may include cutting, milling, etching, and abrasive blasting.

The first and/or second electrodes may advantageously comprise a material that has a relatively good ability of emitting electrons and is chemically stable, or inert, in relation to the pumped fluid. Further, the material may have a relatively high temperature resistance. Examples of such materials may include e.g. Pt, Au, Ni, W, Zr and stainless steel.

In the present specification, the term 'flow unit' or 'pump' or 'pump unit' interchangeably used.

As outlined above, the method in the fluidic device may be embodied as computer-executable instructions distributed and used in the form of a computer-program product including a computer-readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media (or non-transitory media) includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media (or transitory media) typically embodies computer readable instructions, data structures, program modules or other data in a modulated data signal such as a carrier wave or other transport mechanism and includes any information delivery media.

Further objectives of, features of and advantages with the present invention will become apparent when studying the following detailed disclosure, the drawings and the appended claims. Those skilled in the art realise that different features of the present invention, even if recited in different claims, can be combined into embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which:

FIG. 4 is a schematic perspective view of a first and second electrode of a flow unit according to an embodiment;

All the figures are schematic, generally not to scale, and generally only show parts which are necessary in order to elucidate the invention, whereas other parts may be omitted or merely suggested.

DETAILED DESCRIPTION OF EMBODIMENTS

Figure 1:
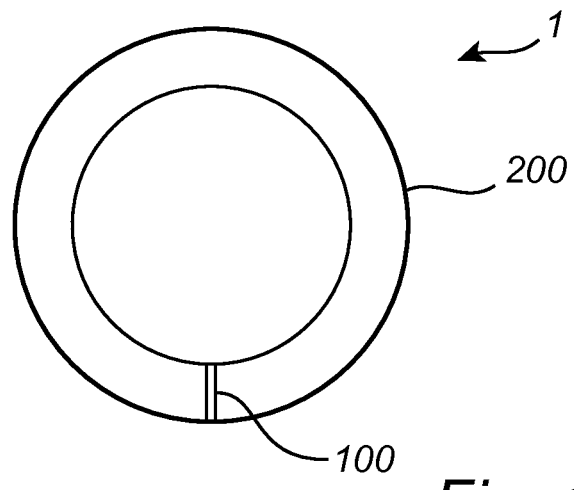
FIG. 1 schematically illustrates a fluidic device comprising an enclosed passage and a flow unit according to an embodiment of the invention.

FIG. 1 shows a fluidic device 1 comprising an enclosed passage 200, e.g. forming a loop, and a flow unit 100. The enclosed passage 200 may e.g. be formed as a tube or channel wherein the end is connected to the beginning so as to allow for a continuous and repeated flow of a circulating fluid in a closed loop system. The flow unit 100 may be arranged to cover an entire cross section of the enclosed passage 200, as indicated in FIG. 1, or to cover only a part of the cross section so as to allow fluid to pass at the side of the flow unit 100. By arranging the flow unit 100 to cover the entire cross section of the passage 200, all fluid has to pass through the flow unit 100 in order to circulate. This allows for an improved control of the flow.

The fluidic device 1 may be operated in at least two different states: an activated state, and a deactivated or off-state. In the activated state, the flow unit 100 may be operated by means of a potential difference inducing a flow through the flow unit 100 and hence a circulating flow in the enclosed passage 100. In the off-state, the flow 100 may be operated at a zero potential difference, or at a potential difference resulting in a reduced or zero net flow of fluid through the flow unit 100, so as to impede or even stop the circulation of the fluid in the enclosed passage. The flow unit 100 may hence be operated as a control valve regulating the flow in the enclosed passage.

Figure 2A:
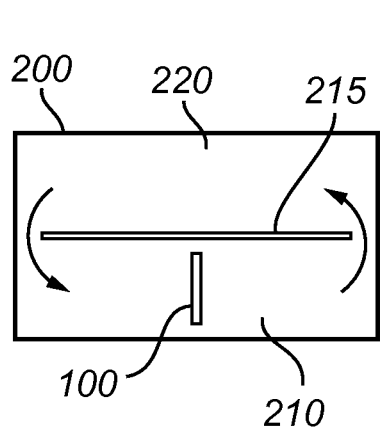
FIGS. 2a and b are schematic cross sections of a fluidic device according to some embodiments.

FIGS. 2a and b show a fluidic device 1 according to embodiments that may be similarly configured as the embodiment discussed in connection with FIG. 1. According to the embodiment depicted in FIG. 2a, the enclosed passage may be defined by a first chamber 210 and a second chamber 220 that are separated by a dividing wall 215 or septum. The dividing wall 215 may comprise gaps or local passages connecting the first chamber 210 and the second chamber 220 with each other, thereby defining a closed loop in which the fluid may circulate. The fluid may circulate through the first chamber 210, enter the second chamber 220 via one of the gaps in the dividing wall 215, passing through the second chamber 220 and enter the first chamber via the second one of the gaps in the wall 220 (the circulating fluid is indicated by arrows in FIG. 2a).

At least one of the chambers, such as e.g. the first chamber 210 may comprise a flow unit 100 as previously described. The flow unit 100 may be configured to induce a flow in the fluid when operated in the activated state, and to impede or reduce a flow in the fluid when operated in a deactivated state or at a reduced voltage difference as compared to the activated state. Thus, the flow unit 100 may be used for affecting or controlling the circulation of the fluid between the first chamber 210 and the second chamber 220.

Figure 2B:
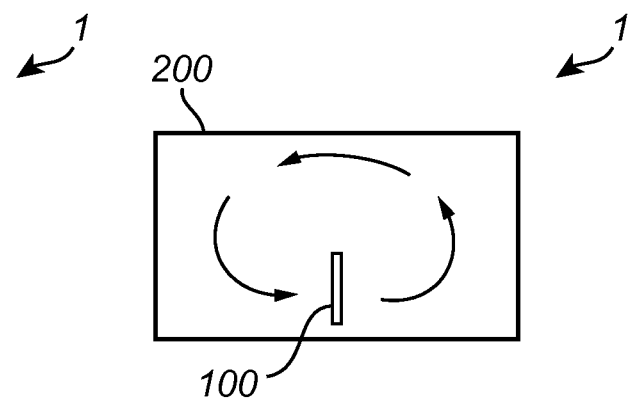

Alternatively, or additionally, the enclosed passage 200 may form a single chamber as shown in FIG. 2b. In such case, the flow may circulate within the chamber defined by the enclosed passage, as indicated by the arrows. The flow unit 100 may be arranged to induce the flow, preferably at a position relatively close or adjacent to a wall portion of the chamber. From such position, the flow unit 100 may induce a motion or flow of the fluid in a direction along the wall portion, thereby causing the fluid to circulate accordingly.

Figure 3:
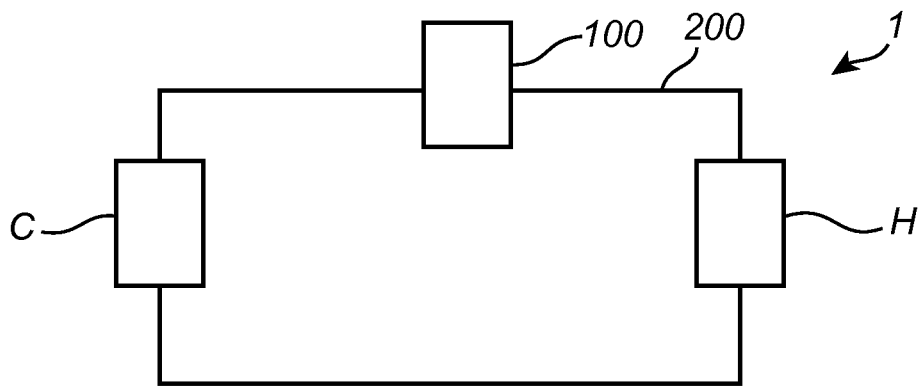
FIG. 3 is a schematic diagram of a fluidic device according to an embodiment, wherein the enclosed passage is thermally connected to heat exchangers.

FIG. 3 is a schematic representation of a system or fluidic device according to an embodiment that may be similarly configured as any one of the previously described embodiments. In FIG. 3, the enclosed passage is represented by line 200 and the flow unit by the box 100. The enclosed passage may be connected to one or several heat exchangers C, H allowing heat to be added or removed from the fluid. The connection may e.g. be thermal and/or fluidic, and the heat transferring means C, H may e.g. comprise a heat sink C and/or a heat source H.

FIG. 4 shows an example of a flow unit 100 of a fluidic device according to embodiments similar to the embodiments of FIGS. 1 to 3. The flow unit 100 may comprise a first electrode, or emitter 110, comprising bridges 111 and joints 112 forming a grid that allows a fluid to flow through the emitter 110. The emitter 110 may have a lateral extension in a plane perpendicular to the intended flow direction, which is indicated by an arrow in FIG. 4. According to this embodiment, the second electrode, or collector 120, comprises bridges 121 and joints 122 that are arranged in a similar grid the one described with reference to the emitter 110. Consequently, the collector 120 may have a lateral extension in a plane perpendicular to the direction of the flow such that both the emitter 110 and the collector 120 are parallel to each other. Although not illustrates in FIG. 4, it will be appreciated that the second electrode 120 may be provided in other shapes and configurations than a grid. The second electrode 120 may e.g. be formed as, or comprise, one or several wires (which may have a main direction of extension in a plane essentially parallel with the first electrode 110) or pillars, needles, cylinders or rods that may be oriented e.g. along the direction of the flow.

As indicated in the present figure, the emitter 110 and the collector 120 may be arranged spaced apart from each other in the flow direction by a positive distance d. The spacing may e.g. be maintained by a support arrangement, or grid spacer 130 (not shown in FIG. 4) being arranged between the emitter 110 and the collector 120. A relatively narrow gap d may be desirable since such gap may provide a relatively high electric field and thus enhance the electrohydrodynamic effect affecting the flow rate. The use of a grid spacer 130, which may have a well defined thickness, may advantageously reduce the risk of a shortcut or breakdown between the emitter 110 and the collector 120. As will be discussed in more detail below, the grid spacer 130 may e.g. have a similar configuration as the emitter 110 and/or the collector 120, i.e. comprising a grid of bridges 111, 121 and joints 112, 122. The grid spacer 130 may however have other configurations as well, such as e.g. being formed as a frame supporting the lateral edges of the emitter 110 and/or collector 120.

It will also be realised that the grid may have one of a broad variety of shapes, wherein the edges and the joints e.g. may form a grating, a net, a hole pattern, a honeycomb structure, or other structures or patterns suitable for admitting a flow through the emitter 110 and/or collector 120.

FIGS. 5a-d show cross sections of a portion of the emitter 110 and collector 120 of a flow unit similarly configured as the flow units described with reference to any one of the previous figures. The cross section is taken through three pairs of the bridges 111, 121 and along a plane parallel to the flow direction. According to this embodiment, the bridges 111 of the emitter 110 is arranged at a constant distance d from the bridges 121 of the collector 120, wherein the bridges 111 of the emitter have a maximum height $h_1$ in the flow direction and a maximum gauge $w_1$ in a direction orthogonal to the flow direction. The maximum height $h_1$ is greater than the maximum gauge $w_1$ so as to enable a relatively stable and rigid grid structure that can carry a relatively large load in the flow direction without a risk of deforming or collapsing, and yet have a relatively large open area allowing the fluid flow. According to this embodiment, the collector 120 may be formed of a grid having a similar relationship between the maximum height $h_2$ and the maximum gauge $w_2$ of the bridges 121. The ratio between the maximum height $h_1$, $h_2$ and the maximum gauge $w_1$, $w_2$ may e.g. be larger than 1, and more preferably larger than 2.

The cross section of the bridges 111 of the emitter 110 may comprise a downstream portion 113 having a tapered shape forming an edge or a point 114 facing the collector 120. The tapered shape may e.g. be manifested as an edge or narrow end 114 extending along the downstream portion 113 of the bridge 111, or one or several protrusions having a shape conforming to e.g. a tip, needle, pyramid, dome, etc. As the emitter 110 is subjected to an electric potential difference, there may be an electric field concentration at the edge 114 of the tapered portion 113 which may facilitate or promote emission of electrons.

Correspondingly, the portion of the bridges 121 of the collector 120 which face the emitter 110 may be provided with a dedicated shape or surface structure for enhancing collection of the emitted electrons. The bridges 121 and/or joints 122 of the collector 120 may e.g. be provided with a concave surface portion 123 increasing the surface area, and/or a structured surface comprising microscopic protrusions and/or recesses 124 increasing the active surface area. The structures 124 may e.g. be formed by molding, electroplating, surface treatment or by selectively adding and/or removing material by e.g. abrasive blasting, etching, milling, grinding, etc.

Figure 5A:
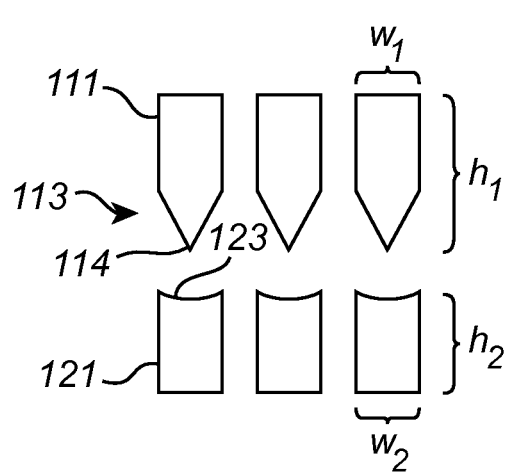
FIGS. 5a-d show cross sectional portions of the first and second electrode of a flow unit according to an embodiment.

FIG. 5a shows an example embodiment wherein the emitter 110 and the collector 120 are formed by screen printed Pt paste which has been sintered at about 800° C. so as to form a grid of bridges having a maximum height $h_1$, $h_2$ of about 100-200 μm and a maximum gauge $w_1$, $w_2$ of about 50 μm. As shown in FIG. 2b, the collector 120 has been equipped with a micro-structured surface portion 124, facing the emitter 110, by means of micro-blasting, wherein the surface is bombarded with sharp, micrometer-sized particles so as to increase the area of the surface.

Figure 5B:
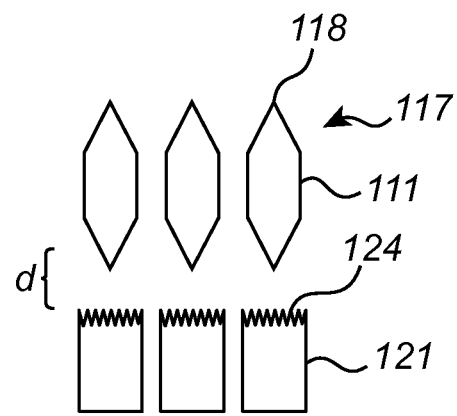
Figure 5C:
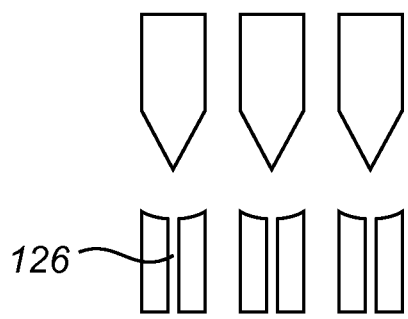
Figure 5D:
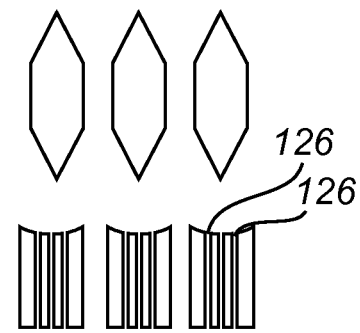

The flow units 100 in FIGS. 5b-d are similar to the flow unit 100 described with reference to FIG. 5a. According to FIG. 5b, the emitter 110 is further provided with a tapered upstream portion 117, forming a relatively sharp edge 118 directed towards the fluid flow so as to reduce the flow resistance and hence enhance the flow through the emitter 110. As indicated in FIGS. 5c and d, the collector 120 may further define channels 126 extending through the bridges 121 and/or the joints 122 (not shown) of the grid in order to decrease the flow resistance. The channels 126 may e.g. be effected by etching, such as e.g. reactive ion etching, wet etching, etc.

Figure 6A:
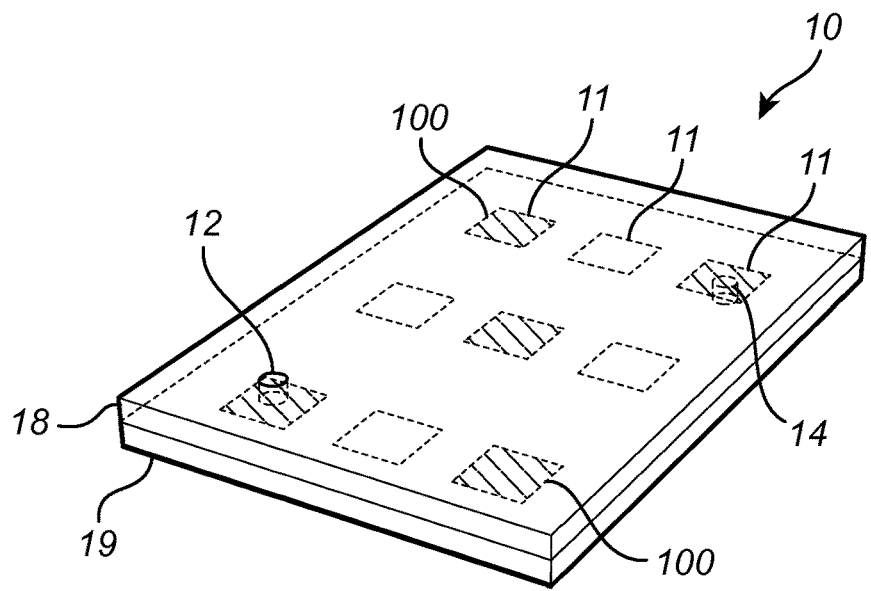
FIGS. 6a and b are schematic views of an array of flow units according to embodiments of the invention.

FIG. 6a shows an array 10, or pump assembly, comprising a plurality of flow units 100. The flow units 100 may be arranged in a cell structure comprising a lid part 18 and a bottom part 19. In FIG. 6a, the outline of each cell 11 of the cell structure is indicated by a dashed line, whereas a cell 11 comprising a flow unit 100 is indicated by diagonal cross-hatching. The array 10 may comprise a first opening 12 for supply of fluid to the array 10. The first opening 12 may e.g. be arranged in the lid part 18. Further, a second opening 11 for outputting the fluid may be arranged in the bottom part 19 (indicated by a dashed line). According to the present embodiment, the array 10 may comprise e.g. five flow units 100 arranged in every second cell 11 of the cell structure. The flow units 100 may be arranged in a same direction or orientation such that the direction of flow of the fluid is essentially parallel for each one of the flow units 100. The cells 11 may be in fluid communication with one or several other cells 11 so as to allow a fluid to flow between the cells, preferably from one cell 11 to a neighbouring cell 11. During operation, a fluid may enter the cell structure via the first opening 12 and pass through a first flow unit 100 to a second flow unit 100 via neighbouring or intermediate cell 11, and eventually exit the cell structure through the second opening 14. Thus, the first opening 12 may be arranged, during operation, to receive fluid from an upstream side of the enclosed passage or loop, whereas the second opening 14 may be arranged to deliver fluid to a downstream side of the enclosed passage.

Figure 6B:
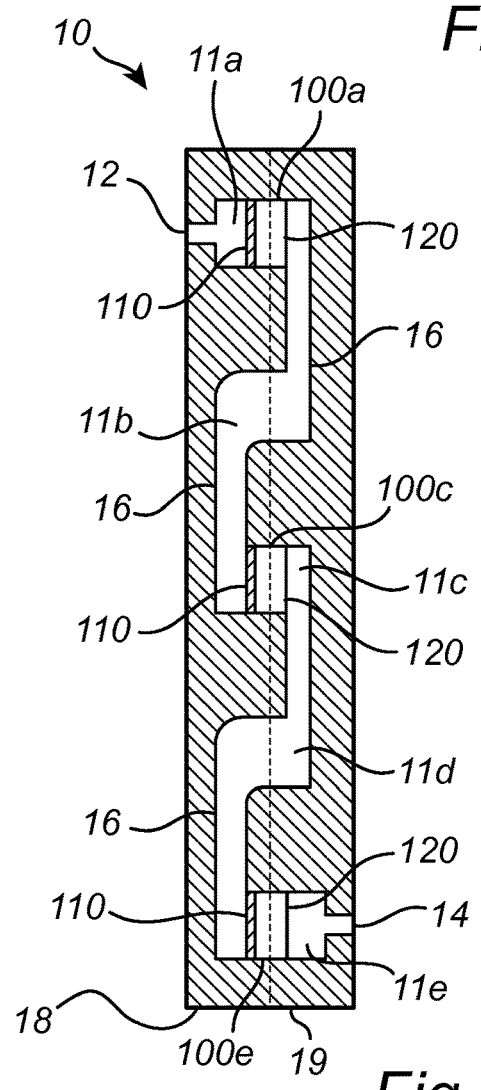

FIG. 6b is a cross sectional side view of an array 10 that is similarly configured as the array 10 of FIG. 6a. The array 10 of flow units 100a, 100c, 100e is arranged in cells 11a, 11c, 11e defined by a lid part 18 and a bottom part 19 comprising cell separating walls 17. The cells 11a, 11b, 11c, 11d, 11e are connected to each other by means of channels 16 adapted to let a flow of fluid pass from a downstream side of a flow unit 100a, via an empty cell 11b, to an upstream side of a neighbouring flow unit 100c. Each flow unit 100a, 100c, 100e comprise a first electrode 110, such as e.g. a grid shaped emitter, and a second electrode 120, such as e.g. a metal plate provided with a through-hole.

During operation, fluid may be entered through a first opening 12 and brought in fluid contact with the first electrode 110 of the flow cell 100a arranged in cell 11a. The fluid may be brought to flow by means of an electric field induced between the first electrode 110 and the second electrode 120, and continue through the channel 16 and the neighbouring, empty cell 11b to the next flow unit 100c. This process is repeated until the fluid reaches the second opening 14, through which it may exit the array 10.

As indicated in FIGS. 6a and b, the flow units 100 may be oriented in the same direction, allowing the fluid to pass through each flow unit 100 in the same flow direction. Such arrangement of the flow units 100 may require a channel 16 and, according to the present example, an intermediate empty cell 11b, 11d for "reversing" the flow exiting at the downstream side of a first flow unit 100 before it can enter at the upstream side of a second flow unit 100.

Figure 7A:
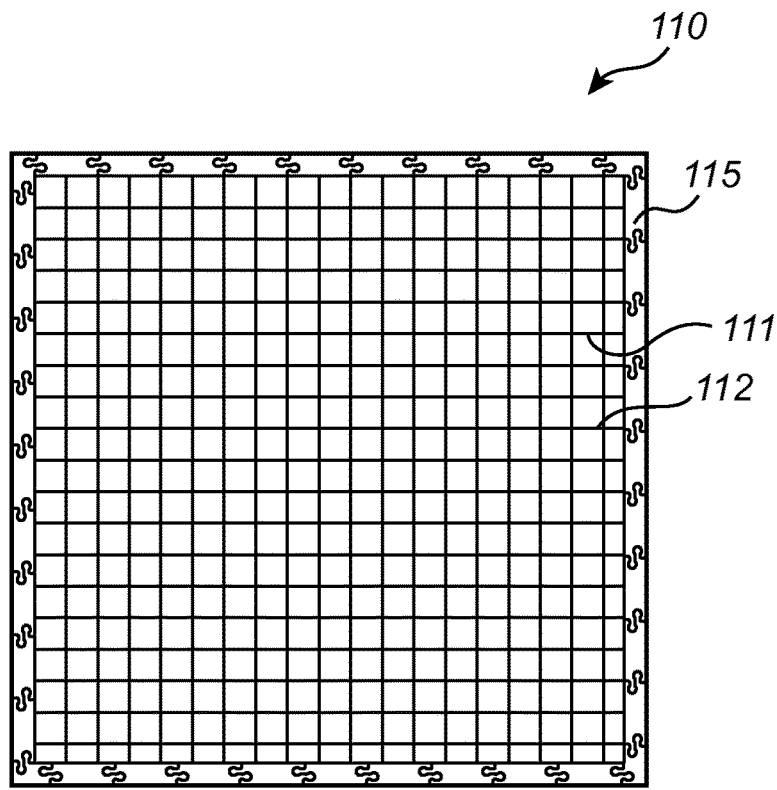
FIGS. 7a and b are top views of an electrode of a flow unit provided with a deformation structure according to embodiments of the invention.

FIG. 7a shows a deformation structure 115 of a grid acting as e.g. an emitter 110 in a flow unit 100 according to embodiments of the present invention. The grid comprises bridges 111 and joints 112 in accordance with the previously described embodiments. As indicated in FIG. 7a, the deformation structure 115 is composed of bridges 111 that are curved in a plane normal to the flow direction. The curved shape may e.g. be formed during manufacturing of the bridges 111, or induced by e.g. thermal stresses occurring during use of the flow unit 100. The curved shape may also comprise a weakened portion, e.g. a portion having a reduced gauge, so as to make it easier to deform upon heat induced stresses. As the material of the grid may expand with an increasing temperature, the bridges 111 of the deformation structure 126 may be compressed by compressive forces acting in the length direction of the bridges 111. By length direction should be understood the direction of extension between a first joint and a second joint. Thereby the lateral expansion of the grid may be absorbed by the deformation structure 115 and thermally induced stresses reduced so that the emitter 110 other than the deformation structure 115 may keep its original shape despite thermal expansion. It should however be understood that the forces acting on the bridges 111 of the deformation structure 115 also, or alternatively, may be caused by e.g. a torsional moment, or torque, acting on the structure.

Figure 7B:
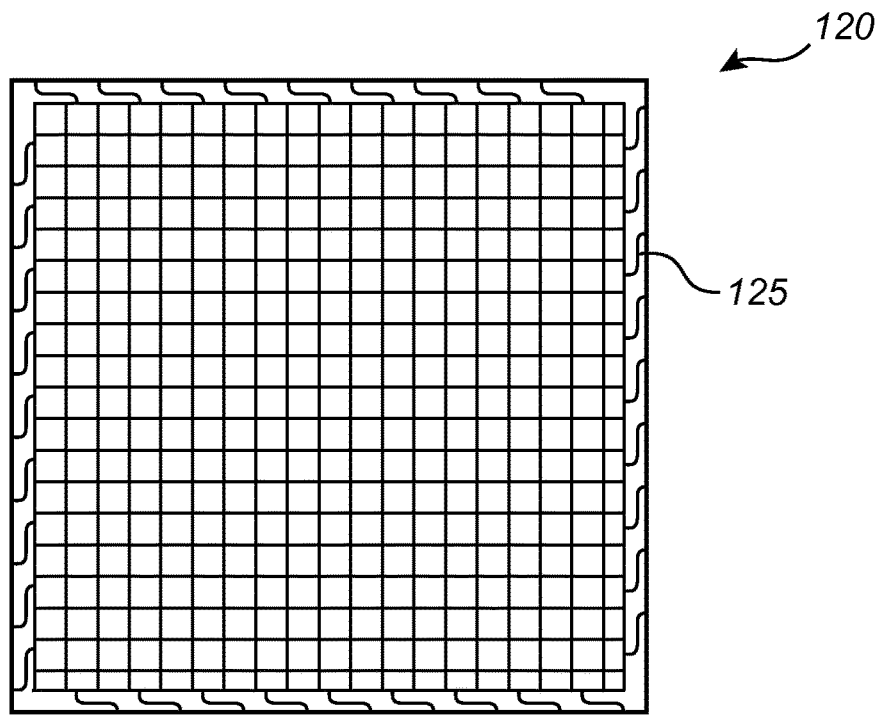

FIG. 7b shows a similar deformation structure 125 as described with reference to FIG. 8a, wherein the deformation structure 125 is formed of bridges 121 of a collector 120 of a flow unit 100 according to an embodiment. It will however be understood that the flow unit 100 may be provided with deformation structures 115, 125 arranged in any one, or several, of the emitter 110, the collector 120, and the support structure 130.

The deformation structure 115, 125 may be provided in an emitter 110 and/or collector 120 that is attached to a support structure 130, wherein in the support structure 130 may have a coefficient of thermal expansion (CTE) that differs from the CTE(s) of the emitter 110 and/or collector 120. In case the emitter 110 and/or collector 120 is/are rigidly attached to the support structure 130, the risk for deformations, such as e.g. bending and flexures, and damages such as fractures, disconnected or loosening joints etc. may be reduced by the deformation structure 115, 125. Thereby, reliability and useful life of the flow unit 100 may be increased.

Figure 8:
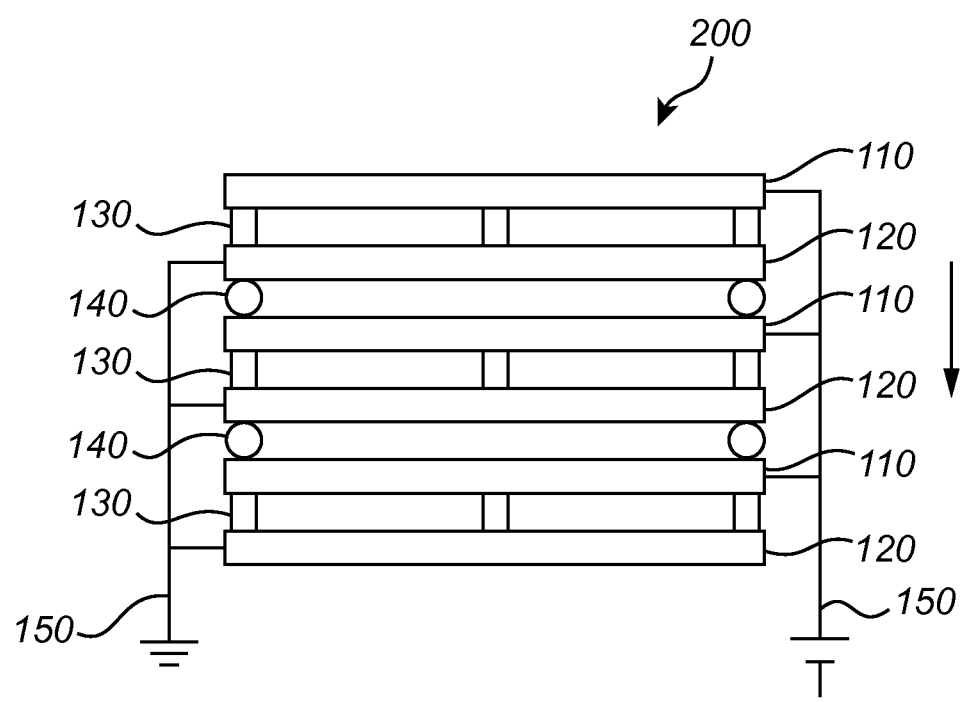
FIG. 8 is a cross section of a flow unit according to an embodiment, comprising a stack of a plurality of electrodes.

FIG. 8 shows a cross section of flow unit 200 comprising a stacked structure of three first electrodes 110 and three second electrodes 210 according to any one of the previously described embodiments. The cross section is taken along the direction of the flow (indicated by an arrow in FIG. 8) and across a respective bridge 111, 121 of the grids of the electrodes 110, 120. A grid spacer 130 is arranged to separate the emitter 110 and the collector 120 electrodes from each other in the direction of the flow. According to this embodiment, the emitters 110 and collectors 120 may comprise e.g. Pt, Au, or stainless steel forming e.g. the bulk material or a surface coating.

The grid spacer 130 may e.g. be formed as a grid supporting the emitters 110 and the collectors 120. As illustrated in FIG. 8, the grid spacer 130 may comprise a peripheral frame of bridges to which the edge portions of the emitter 110 and the collector 120 are attached by e.g. welding, soldering or gluing. Alternatively, or additionally, the grid spacer 130 may comprise other spacing structures such as pillars or spacers, etc. The grid spacer 130 may also comprise one or several spacing members, such as e.g. additional bridges or pillars, supporting the centre portions of the emitter and collector. The grid spacer 130 may also comprise a deformation structure 115, 125 (not shown) similar to the deformation structure described with reference to FIGS. 8a and b.

The spacing d of the emitter and collector may be determined by the height of the bridges of the grid spacer 130, which may hence determine the magnitude of the electric field induced between the emitter 110 and the collector 120. The distanced between the emitter 110 and the collector 120 may e.g. be within the range of 10 µm and 1000 µm.

Further, the grid spacer 130 may comprise an alignment structure for facilitating alignment of the emitters 110 and the collectors 120, and/or alignment of the flow units 100 in the array.

The invention claimed is:

1. An electrohydrodynamic (EHD) device, comprising:
an enclosed passage adapted to convey a circulating dielectric liquid; and
a flow unit arranged in the enclosed passage, wherein the flow unit comprises:
a first electrode; and
a second electrode offset from the first electrode in a downstream direction of a flow of the circulating dielectric liquid, the first electrode and the second electrode being connectable to a voltage source;
wherein the first electrode is formed as a grid structure and arranged to allow the circulating dielectric liquid to flow through the first electrode;
wherein at least a portion of the enclosed passage is adapted to provide a thermal connection to allow transfer of heat between the circulating dielectric liquid and a surrounding of the EHD device; and
wherein the enclosed passage defines a closed loop in which the circulating dielectric liquid circulates.

2. The EHD device of claim 1, wherein:
the first electrode comprises bridges and joints forming the grid structure;
at least a portion of at least one of the bridges has a maximum height in a direction parallel to a direction of the flow and a maximum gauge in a direction orthogonal to the direction of the flow; and
said maximum height is larger than said maximum gauge.

3. The EHD device of claim 1, wherein the flow unit is arranged to cover at least part of a cross section of the enclosed passage.

4. The EHD device of claim 1, wherein the flow unit is arranged to cover an entire cross section of the enclosed passage.

5. The EHD device of claim 1, wherein the EHD device comprises an array of flow units arranged to have a lateral extension in a common lateral plane, wherein a downstream side of a first one of the flow units is in fluid communication with an upstream side of a second one of the flow units so as to allow the circulating dielectric liquid to pass through said first and second one of the flow units.

6. The EHD device of claim 1, wherein the enclosed passage is adapted to be thermally connected to a heat exchanger.

7. The EHD device of claim 6, wherein the heat exchanger is a heat sink or a heat source.

8. The EHD device of claim 1, wherein at least a portion of the enclosed passage is formed as a tube.

9. The EHD device of claim 1, wherein the second electrode is formed as a grid structure.

10. The EHD device of claim 1, wherein at least one of the first electrode and the second electrode comprises a suspension structure arranged to absorb thermally induced deformations in the first electrode or the second electrode, respectively.

11. The EHD device of claim 1, wherein the enclosed passage comprises a first chamber in fluid communication with a second chamber; and wherein the flow unit is adapted to be disposed in the first chamber or the second chamber of the enclosed passage.

12. The EHD device of claim 5, wherein the enclosed passage comprises a first chamber in fluid communication with a second chamber; and wherein the flow unit is adapted to be disposed in the first chamber or the second chamber of the enclosed passage.

13. A method of controlling a circulating dielectric liquid in an electrohydrodynamic (EHD) device, the method comprising:
   activating a flow unit so as to induce a flow of the circulating dielectric liquid in the EHD device, wherein the flow unit is arranged in an enclosed passage that is adapted to convey the circulating dielectric liquid, the flow unit comprising a first electrode and a second electrode that is offset from the first electrode in a downstream direction of a flow of the circulating dielectric liquid, the first electrode and the second electrode being connectable to a voltage source, wherein the first electrode is formed as a grid structure and is arranged to allow the circulating dielectric liquid to flow through the first electrode;
   wherein at least a portion of the enclosed passage is adapted to provide a thermal connection to allow transfer of heat between the circulating dielectric liquid and a surrounding of the EHD device; and
   wherein the enclosed passage defines a closed loop in which the circulating dielectric liquid circulates; and
   deactivating the EHD device so as to impede the flow of the circulating dielectric liquid in the EHD device.

14. The method of claim 13, wherein activating the flow unit comprises applying a voltage difference between the first electrode and the second electrode.

15. The method of claim 13, wherein the flow unit comprises:
   the first electrode comprises bridges and joints forming the grid structure;
   at least a portion of at least one of the bridges has a maximum height in a direction parallel to a direction of the flow and a maximum gauge in a direction orthogonal to the direction of the flow; and
   said maximum height is larger than said maximum gauge.

16. The method of claim 13, wherein deactivating the EHD device comprises turning off the flow unit, and the EHD device is in an operational mode when the flow through the flow unit is reduced or eliminated.

17. The method of claim 14, wherein deactivating the EHD device comprises reducing or removing a voltage difference between the first electrode and the second electrode.

18. The method of claim 14, wherein
   the first electrode comprises bridges and joints forming the grid structure;
   at least a portion of at least one of the bridges has a maximum height in a direction parallel to a direction of the flow and a maximum gauge in a direction orthogonal to the direction of the flow; and
   said maximum height is larger than said maximum gauge.

19. The method of claim 13, wherein the enclosed passage is adapted to be thermally connected to a heat exchanger and the heat exchanger comprises at least one of a heat sink or a heat source.

20. The method of claim 13, wherein the enclosed passage comprises a first chamber in fluid communication with a second chamber; and wherein the flow unit is adapted to be disposed in the first chamber or the second chamber.

* * * * *

UNITED STATES PATENT AND TRADEMARK OFFICE
CERTIFICATE OF CORRECTION

Page 1 of 1

| | |
|---|---|
| PATENT NO. | : 11,708,824 B2 |
| APPLICATION NO. | : 16/071476 |
| DATED | : July 25, 2023 |
| INVENTOR(S) | : Robert Thorslund, Peter Nilsson and Are Björneklett |

It is certified that error appears in the above-identified patent and that said Letters Patent is hereby corrected as shown below:

On the Title Page

Item (72), after "Peter Nilsson, Sundbyberg (SE)", insert:
--Are Björneklett, Västerås (SE)--

Signed and Sealed this
First Day of April, 2025

Coke Morgan Stewart
*Acting Director of the United States Patent and Trademark Office*